US008606428B2

(12) United States Patent
Chan

(10) Patent No.: US 8,606,428 B2
(45) Date of Patent: Dec. 10, 2013

(54) COOLING FAN CONTROL SYSTEM

(75) Inventor: Gary Chan, Palo Alto, CA (US)

(73) Assignee: Cisco Technology, Inc., San Jose, CA (US)

(*) Notice: Subject to any disclaimer, the term of this patent is extended or adjusted under 35 U.S.C. 154(b) by 320 days.

(21) Appl. No.: 13/035,553

(22) Filed: Feb. 25, 2011

(65) Prior Publication Data
US 2012/0218707 A1 Aug. 30, 2012

(51) Int. Cl.
G05D 23/00 (2006.01)

(52) U.S. Cl.
USPC .................................. 700/300; 361/679.48

(58) Field of Classification Search
USPC ......................................................... 700/300
See application file for complete search history.

(56) References Cited

U.S. PATENT DOCUMENTS

| 6,134,667 | A | * | 10/2000 | Suzuki et al. | 713/300 |
| 6,601,168 | B1 | | 7/2003 | Stancil et al. | 713/100 |
| 6,643,128 | B2 | | 11/2003 | Chu et al. | 361/687 |
| 7,098,617 | B1 | | 8/2006 | Oljaca et al. | 318/268 |
| 8,164,434 | B2 | * | 4/2012 | Gross et al. | 340/501 |
| 8,265,799 | B2 | * | 9/2012 | Eto | 700/300 |
| 2003/0216882 | A1 | * | 11/2003 | Lai et al. | 702/132 |
| 2003/0234625 | A1 | | 12/2003 | Frankel et al. | 318/268 |
| 2005/0030171 | A1 | | 2/2005 | Liu et al. | 340/500 |
| 2005/0174737 | A1 | | 8/2005 | Meir | 361/697 |
| 2008/0028778 | A1 | * | 2/2008 | Millet | 62/129 |
| 2009/0271049 | A1 | | 10/2009 | Kinney et al. | 700/300 |
| 2011/0057589 | A1 | | 3/2011 | Hung | 318/400.01 |
| 2011/0077796 | A1 | | 3/2011 | Aklilu et al. | 700/300 |
| 2011/0103008 | A1 | | 5/2011 | Aklilu et al. | 361/679.48 |
| 2011/0176275 | A1 | * | 7/2011 | Sato | 361/695 |

* cited by examiner

Primary Examiner — Sean P. Shechtman
Assistant Examiner — Steven Garland
(74) Attorney, Agent, or Firm — Brinks Gilson & Lione

(57) ABSTRACT

In order to adequately but not excessively or unnecessarily cool heat generating electrical components and decrease the noise produced by fans used to cool the heat generating electrical components in an electrical hardware system, an environmental controller controls the speeds of the fans using at least two temperature sensors. In one example, a first temperature sensor measures a hotspot component temperature and generates a hotspot component temperature value, and a second temperature sensor measures an air inlet temperature and generates an air inlet temperature value. The environmental controller controls the speeds of the fans based on the difference between the measured hotspot component temperature value and a target hotspot component temperature value calculated based on the measured air inlet temperature value and a predefined function.

21 Claims, 5 Drawing Sheets

COOLING FAN CONTROL SYSTEM

FIELD

The present embodiments relate to the control of cooling fans.

BACKGROUND

As electronic devices have gotten smaller and faster, the need for cooling systems has increased. Cooling systems may include multiple fans. For example, a computer may have a processor fan, a motherboard fan, a power supply fan, and/or a video card fan. Heat generating electrical components on the motherboard and in the power supply of the computer may heat up to varying degrees due to power dissipation caused by power loading. The various cooling fans may share a common air inlet, so fans for the motherboard and the power supply, for example, compete for air intake volumetric flow. The various cooling fans also create noise. Although the amount of noise produced has little impact on the performance of the fan or the system being cooled, noise can negatively affect people nearby.

DETAILED DESCRIPTION OF THE DRAWINGS

Overview

Figure 1:
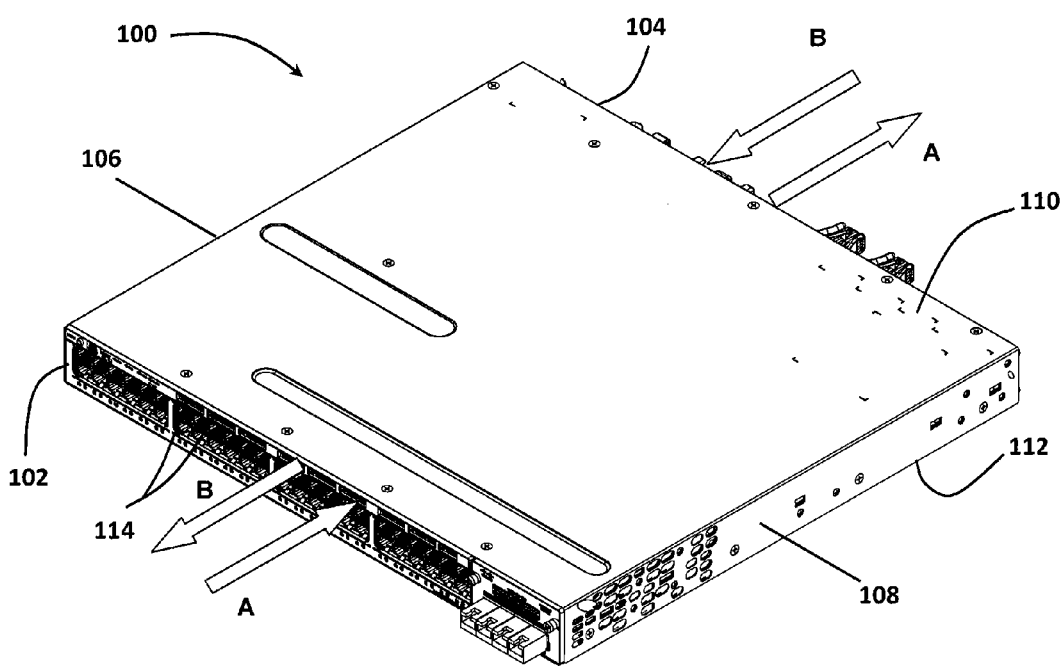
FIG. 1 illustrates a perspective view of one embodiment of a housing for an electrical hardware system.

Different electrical components within an electrical hardware system may heat up to varying degrees due to the waste heat caused by power loading. As a result, there may be a large variation in air flow requirements for the different electrical components. The different electrical components are cooled for proper function and long term reliability.

An inlet sensor measures inlet air temperature, and a hotspot sensor measures a location of interest, such as the case or junction temperature of a critical component within the electrical hardware system. The temperature at the hotspot sensor may represent the thermal condition of the electrical hardware system. The measured inlet air temperature is used as an input to a fan curve table or a curve-fit equation, for example, and a target hotspot temperature is output. A software algorithm adjusts the speed of one or more fans in the electrical hardware system so that the measured hotspot temperature matches, within a tolerance, the target hotspot temperature.

In order to adequately but not excessively or unnecessarily cool heat generating electrical components and decrease the noise produced by fans used to cool the heat generating electrical components in an electrical hardware system, an environmental controller controls the speeds of the fans using at least two temperature sensors. In one example, a first temperature sensor measures a hotspot component temperature value, and a second temperature sensor measures an air inlet temperature value. The environmental controller controls the speeds of the fans based on the difference between the measured hotspot component temperature value and a target hotspot component temperature value calculated based on the measured air inlet temperature value and a predefined function.

In one embodiment, an apparatus includes a memory configured to store a predefined function. The apparatus also includes a processor configured to calculate a target temperature value for a first position based on the predefined function and a measured temperature value at a second position. The processor is configured to calculate a difference value between a measured temperature value at the first position and the target temperature value for the first position. The processor is also configured to generate a fan speed control signal based on the calculated difference value.

In another embodiment, a method includes determining a first temperature value and determining a second temperature value. The first temperature value is determined at a first position within an electrical hardware system, and the second temperature value is determined at a second position within the electrical hardware system. The method includes calculating, with a processor, a target first temperature value as a function of the determined second temperature value. The method also includes calculating a difference value between the determined first temperature value and the calculated target first temperature value, and generating a control signal for a fan coupled with the electrical hardware system as a function of the calculated difference value.

In yet another embodiment, a non-transitory tangible storage media is encoded with logic, the logic being executable by a processor to calculate a target temperature value for a first position as a function of temperature data for a second position, calculate a difference value between temperature data for the first position and the target temperature value for the first position, and generate a control signal based on the difference value.

Example Embodiments

FIG. 1 illustrates a perspective view of one embodiment of a housing 100 for an electrical hardware system, such as a box-type housing for stacking. The housing 100 includes a front 102, a back 104, a first side 106 and a second side 108. The housing 100 also includes a top 110 and a bottom 112. The box-type housing 100 may be any number of shapes including, for example, a rectangular box. Other non-box housings may be used.

The front 102 of the housing 100 and the top 110 of the housing 100 form a plurality of slots 114 (e.g., air outtakes/intakes). The plurality of slots 114 may be spaced along the length or a portion of the length of the front 102 of the housing 100. In one embodiment, a single slot runs the length of the front 102 of the housing 100. In another embodiment, the front 102 of the housing 100 includes a plurality of equally-sized holes. Additional openings (e.g., holes and/or slots) may be included in the front 102, the back 104, the first side 106, the second side 108, the top 110 and/or the bottom 112 of the housing 100. The openings may be near but not on the back 104 and/or front 102.

The back 104 of the housing 100 may include a plurality of holes (e.g., air intakes/outtakes; not shown). The plurality of holes may be equally-sized and equally-spaced or unequally sized and unequally spaced. Other patterns of holes or a single hole may be used. In one embodiment, the back 104 and the top 110 of the housing 100 form a slot that extends along the length of the back 104 of the housing 100. In another embodiment, the back 104 and the top 110 of the housing 100 form a plurality of slots spaced along at least a portion of the length of the back 104 of the housing 100.

In one embodiment, air is pulled into the housing 100 at the plurality of slots 114 in the front 102 of the housing 100 and pushed out of the housing 100 at the plurality of holes in the back 104 of the housing 100, as shown by arrow A. In another embodiment, air is pulled into the housing 100 at the plurality of holes in the back 104 of the housing 100 and pushed out of the housing 100 at the plurality of slots 114 in the front 102 of the housing 100, as shown by arrow B. In other embodiments, other airflow paths are possible.

Figure 2:
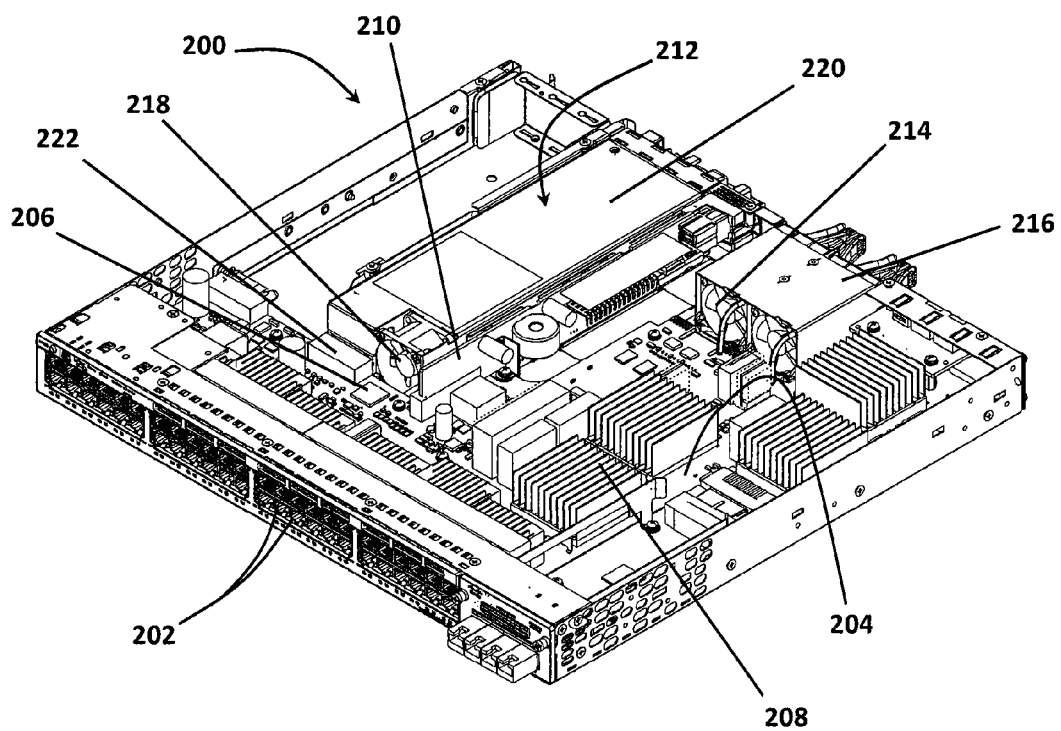
FIG. 2 illustrates a perspective view of one embodiment of an interior of a switch including the housing of FIG. 1.

FIG. 2 illustrates a perspective view of one embodiment of a network communications switch 200 including the housing 100 of FIG. 1 or a different housing. Similar arrangements may be provided for other devices than a switch. FIG. 2 illustrates the switch 200 with the top 110 of the housing 100 (as shown in FIG. 1) removed. The switch 200 includes a plurality of components 202 such as, for example, a plurality of input/output (I/O) connectors (e.g., RJ45 connectors or SFP connectors) at the front 102 of the housing 100. I/O is used for only input, only output, or both input and output connections.

The bottom 112 of the housing 100 may support a printed circuit board (PCB) 204 (e.g., a motherboard (MB)) or a substrate, and a plurality of heat generating electrical hardware components 206 may be supported by and electrically connected (e.g., soldered) to the PCB 204. The plurality of heat generating electrical hardware components 206 may include, for example, processors, circuits, transistors, memory devices, power supplies, or any other electronic components or parts included in or on the housing 100.

Heat sinks 208 may be attached to some or all of the plurality of heat generating electrical hardware components 206. The heat sinks 208 may be attached to the heat generating electrical hardware components 206 using, for example, a thermal interface material, a thermal adhesive, nut/bolt combinations, other devices, or a combination thereof. The heat sinks 208 may aid in the transfer of heat from the plurality of heat generating electrical hardware components 206 to the surrounding air.

The bottom 112 of the housing 100, the PCB 204 or another part of the switch 200 may support a separation wall 210. The separation wall 210 may extend at least part of the width of the switch 200, for example. The separation wall 210 may be supported using, for example, an adhesive, nut/bolt combinations, tabs and corresponding recesses, other devices, or a combination thereof. The separation wall 210 may direct a flow of air pulled in or pushed out of the plurality of slots 114 in the front 102 of the housing 100 around the heat sinks 208 attached to some or all of the heat generating electrical hardware components 206.

One or more power supply units 212 (e.g., one installed in FIG. 2) may be supported by the bottom 112 of the housing 100 when the one or more power supply units 212 are installed in the housing 100. The power supply unit 212 may be releasably attached to the back 104 of the housing 100 using, for example, captive screws attached to part of the power supply unit 212, and corresponding holes (e.g., tapped holes) in the back 104 of the housing 100. In other embodiments, the one or more power supply units 212 may be attached to the housing 100 using, for example, nut/bolt combinations, flanges, tabs, other devices, or a combination thereof. The plurality of holes in the back 104 of the housing 100 may be included in the one or more power supply units 212 or may be separate from the power supply units 212.

In one embodiment, the separation wall 210 may also separate air flow between the one or more power supply units 212 and one or more of the heat sinks 208. In either flow direction, the separation wall 210 may prevent the one or more heat sinks 208 from adding heat to the power supply units 212 and may prevent the power supply units 212 from adding heat to the one or more heat sinks 208.

The switch 200 may include a plurality of air movers 214 (e.g., two variable speed axial fans) at or adjacent to the back 104 of the housing 100. The two axial fans 214 may be attached to a fan housing 216 using screws and corresponding holes in the two axial fans 214, for example. The two axial fans 214 may be supported by and electrically connected to the PCB 204, and the fan housing 216 may be releasably attached to the back 104 of the housing 100 using, for example, captive screws attached to part of the fan housing 216, and corresponding holes (e.g., tapped holes) in the back 104 of the housing 100. In other embodiments, the two axial fans 214 may be attached to the housing 100 and/or the PCB 204 using, for example, nut/bolt combinations, flanges, tabs, other devices, or a combination thereof.

The two axial fans 214 may pull air into the plurality of slots 114 in the front 102 of the housing 100 to flow around the heat sinks 208 attached to the heat generating electrical hardware components 206 and push air out of the plurality of holes in the back 104 of the housing 100 to cool the heat generating electrical hardware components 206. Alternatively, the two axial fans 214 may pull air into the plurality of holes in the back 104 of the housing 100 and push air around the heat sinks 208 attached to the heat generating electrical hardware components 206 and out of the plurality of slots 114 in the front 102 of the housing 100 to cool the heat sinks 208 and the heat generating electrical hardware components 206. Other types of air movers including, for example, curved fans, cross flow fans, centrifugal fans, backward curve impeller blowers, squirrel cage blowers or stacked axial fans may be used instead of or in addition to the two axial fans 214. In an axial fan, the inflow of air is parallel or collinear with the outflow of air. In a curved fan, the inflow of air is perpendicular or at an angle with the outflow of air. In a cross flow fan, the inflow may be at any angle or parallel with the outflow, and the outflow is spread out to a larger area than the inflow. In a blower or centrifugal blower, the flow of air is created by a rotating cylindrical runner including blades. Centrifugal blowers may include an outlet smaller than the inlet.

Each air mover 214 of the plurality may include a DC brushless motor to rotate the air mover 214. Low voltage such as, for example, 12 V may be used to power the motors of the plurality of air movers 214. In one embodiment, each air mover 214 of the plurality has a diameter of 40 mm. In other embodiments, different sized fans (e.g., 90 mm or 120 mm diameter fans) may be used. The switch 200 may include more or fewer air movers 214 at or adjacent to the back 104 of the housing 100.

Each of the one or more power supply units 212 may include one or more air movers 218 (e.g., an axial fan) attached to a power supply unit housing 220. The axial fan 218 may be attached to the power supply unit housing 220 using screws and corresponding holes in the axial fan 218, for example. In other embodiments, the axial fan 218 may be attached to the power supply unit housing 220 and/or the PCB 204 using, for example, nut/bolt combinations, flanges, tabs, other devices, or a combination thereof. When the power supply unit 212 is installed in the switch 200, the axial fan 218 may be supported by the bottom 112 of the housing 100. The axial fan 218 may be powered by the power supply unit 212. The power supply unit 212 may include a power supply unit-side electrical connector, and the power supply unit 212 may be electrically connected to the PCB 204 via the power supply unit-side electrical connector and a switch-side electrical connector 222.

The axial fan 218 may pull air into the plurality of slots 114 in the front 102 of the housing 100 and push air through the power supply unit 212 and out the plurality of holes in the back 104 of the housing 100 to cool the power supply unit 212. Alternatively, the axial fan 218 may pull air into the plurality of holes in the back 104 of the housing 100 and through the power supply unit 212 and push air out of the plurality of slots 114 in the front 102 of the housing 100 to cool the power supply unit 212. Other types of air movers including, for example, cross flow fans, centrifugal fans, backward curve impeller blowers squirrel cage blowers or stacked axial fans may be used instead of or in addition to the axial fan 218. The axial fan 218 may include a DC brushless motor to rotate a rotor of the axial fan 218. Low voltage such as, for example, 12 V may be used to power the motor of the axial fan 218. In one embodiment, the axial fan 218 has a diameter of 40 mm. In other embodiments, different sized fans (e.g., 90 mm or 120 mm diameter fans) may be used. The switch 200 may include different, additional, or fewer components.

Figure 3:
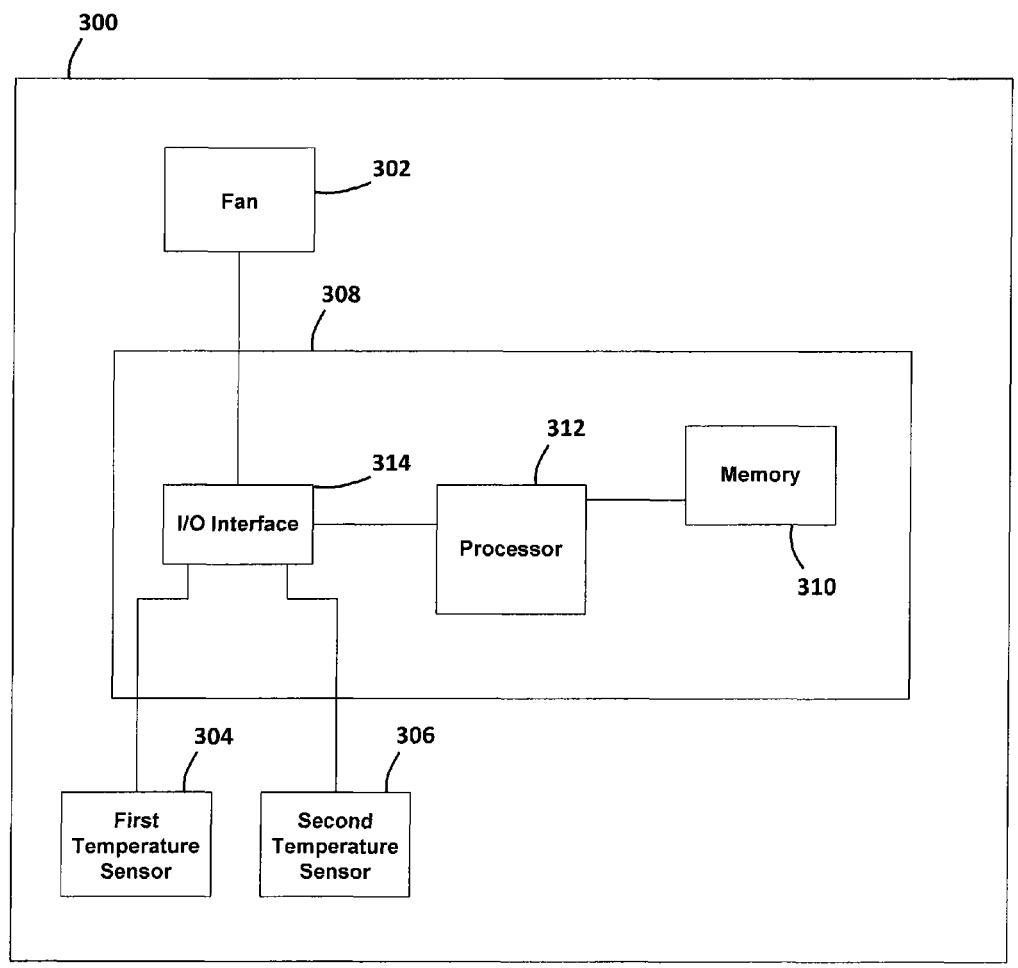
FIG. 3 illustrates an embodiment of a cooling system.

FIG. 3 illustrates an embodiment of a cooling system 300. The cooling system 300 regulates the internal temperature of the switch 200, the power supply unit 212 or another electrical hardware system producing heat. The cooling system 300 includes a fan 302 (e.g., a first fan), a first temperature sensor 304, a second temperature sensor 306, and an environmental controller 308. The environmental controller 308 includes a memory 310, a processor 312, and an I/O interface 314. The fan 302 may be one or more fans, such as both of the two axial fans 214 that are at or adjacent to the back 104 of the housing 100, or the axial fan 218 of the power supply unit 212 or may be a different air mover. The memory 310 and the processor 312 may each be one heat generating electrical component 206 of the plurality of the switch 200.

The environmental controller 308 regulates the operation of the fan 302. The environmental controller 308 may also measure one or more (e.g., two) temperatures associated with different positions in the switch 200 shown in FIG. 2 or a different electrical hardware system, and base the speed or operation of the fan 302 on the measured temperatures.

The first temperature sensor 304 measures the temperature of a heat generating electrical component (e.g., one of the heat generating electrical components 206) that represents the thermal condition of at least part of the electrical hardware system (e.g., a hotspot component), in which the cooling system 300 is located (e.g., the switch 200). The hotspot component may be an output rectifier diode in the power supply unit 212, a main DC-DC converter on the MB 204, or a case or junction of a heat generating electrical component 206 (e.g., a processor) on the MB 204. The first temperature sensor 304 may be located at or adjacent to the hotspot component. In one embodiment, the hotspot component is not a single heat generating electrical component 206, but a group of heat generating electrical components 206. The first temperature sensor 304 may be located at or adjacent to (e.g., proximate to or in the area of) the heat sink 208 attached to the group of heat generating electrical components 206.

The second temperature sensor 306 measures the temperature of inlet air. If air is moved through the switch 200 from the front 102 to the back 104 of the housing 100, the second temperature sensor 306 may be located at or adjacent to the front 102 (e.g., at or adjacent to one slot 114 of the plurality) of the housing 100. If air is moved through the switch 200 from the back 104 to the front 102 of the housing 100, the second temperature sensor 306 may be located at or adjacent to the back 104 (e.g., at or adjacent to the two axial fans 214) of the housing 100. The first temperature sensor 304 and the second temperature sensor 306 may be any number of temperature sensors including, for example, thermocouples, thermistors, thermal diodes, infrared sensors, resistive thermal devices (RTD), digital temperature sensors (e.g., National Semiconductor LM75 digital temperature sensors; a thermal diode and an analog-to-digital converter in an integrated circuit package;) or other devices.

The environmental controller 308 may also monitor installation of one or more components of the cooling system 300 (e.g., the fan 302), and/or receive user input regarding operation of the cooling system 300.

The fan 302 may be configured to receive a DC input or an alternating current (AC) input. The fan 302 may be a 4-wire pulse width modulated (PWM) fan controlled by a PWM input. An input/output interface of the fan may include a power signal, a ground signal, a control signal, and a sense signal. The fan 302 may include a sensor that detects the rotation of a fan motor and produces the sense signal. The sensor may be a magnetic sensor, such as a Hall sensor. Alternatively, the sensor may be an optical sensor or a mechanical sensor. In one embodiment, the sensor is omitted.

The fan 302 may include a tachometer that is configured to measure or detect the speed of the fan 302 from the sense signal. The sense signal may have an amplitude or frequency in proportion to the speed of fan 302. In one embodiment, the tachometer function may be incorporated into the environmental controller 308. The speed of the fan 302 may be measured in revolutions per minute (RPM). Alternatively, the output of the tachometer may also be used to determine whether the fan 302 is moving.

The control signal, which is an input to the fan 302, may be a PWM signal. The PWM signal is a drive signal, in which the relative width of pulses in a train of on-off pulses determines the level of power applied to the motor of the fan 302. As the width of the pulses increases, the speed of the fan 302 may increase, and as the width of the pulses decreases, the speed of the fan 302 may decrease. The control signal may be high frequency, such as 20 kHz or 25 kHz. While the control signal controls the power supplied to the motor of the fan 302, the actual power is applied by the power signal. Alternatively, the function of the power signal and the control signal are combined in a 3-wire fan, where the entire power to the fan is switched on and off, and the environmental controller 308 directly sets the amplitude of the power signal to control the speed of the fan motor. In one embodiment, the speed of the fan motor may be changed using a differential transistor-transistor logic (TTL) signal. In still another embodiment, a variable power supply may be controlled with the control signal such that the voltage and/or current supplied to the fan by the variable power supply is varied by the control signal. Other methods of fan speed control may also be used.

The environmental controller 308 includes the memory 310, the processor 312, and the I/O interface 314. The environmental controller 308 may be implemented with hardware, software, or firmware. The memory 310 may be a volatile memory or a non-volatile memory. The memory 310 may include one or more of a read only memory (ROM), dynamic random access memory (DRAM), a static random access memory (SRAM), a programmable random access memory (PRAM), a flash memory, an electronic erasable program read only memory (EEPROM), static random access memory (RAM), or other type of memory. The memory 310 may include an optical, magnetic (hard drive) or any other form of data storage device. The memory 310 may be located in a remote device or may be removable, such as a secure digital (SD) memory card. In one embodiment, the memory 310 may be built into the processor 312.

The memory 310 may store computer executable instructions. The processor 312 may execute computer executable instructions. The computer executable instructions may be included in computer code. The computer code may be stored in the memory 310. The computer code may be written in any computer language, such as C++, CU, Java, Pascal, Visual Basic, Perl, HyperText Markup Language (HTML), JavaScript, assembly language, extensible markup language (XML) and any combination thereof. The memory 310 is a non-transitory tangible storage media.

The computer code may be logic encoded in one or more tangible media or one or more non-transitory tangible media for execution by the processor 312. Logic encoded in one or more tangible media for execution may be defined as instructions that are executable by the processor 312 and that are provided on the computer-readable storage media, memories, or a combination thereof. Instructions for instructing a network device may be stored on any logic. As used herein, "logic" includes but is not limited to hardware, firmware, software in execution on a machine, and/or combinations of each to perform a function(s) or an action(s), and/or to cause a function or action from another logic, method, and/or system. Logic may include, for example, a software controlled microprocessor, an application specific integrated circuit (ASIC), an analog circuit, a digital circuit, a programmed logic device, and a memory device containing instructions.

The instructions may be stored on any computer readable medium. A computer readable medium may include, but is not limited to, a floppy disk, a hard disk, an ASIC, a compact disk, other optical medium, a random access memory (RAM), a read only memory (ROM), a memory chip or card, a memory stick, and other media from which a computer, a processor or other electronic device can read.

The processor 312 may include a general processor, digital signal processor, ASIC, field programmable gate array, analog circuit, digital circuit, central processing unit (CPU), micro-processor unit (MPU), micro-controller unit (MCU), combinations thereof, or other now known or later developed processor. The processor 312 may be a single device or combinations of devices, such as associated with a network or distributed processing. The processor 312 may include a processor in some or all of the one or more power supply units 212 and/or a processor on the MB 204. Any of various processing strategies may be used, such as multi-processing, multi-tasking, parallel processing, remote processing, centralized processing or the like. The processor 312 may be responsive to or operable to execute instructions stored as part of software, hardware, integrated circuits, firmware, microcode or the like. The functions, acts, methods or tasks illustrated in the figures or described herein may be performed by the processor 312 executing instructions stored in the memory 310. The functions, acts, methods or tasks are independent of the particular type of instructions set, storage media, processor or processing strategy and may be performed by software, hardware, integrated circuits, firmware, micro-code and the like, operating alone or in combination. The instructions are for implementing the processes, techniques, methods, or acts described herein.

The I/O interface 314 may include any operable connection. An operable connection may be one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities may be operably connected to communicate signals to each other directly or through one or more intermediate entities (e.g., processor, operating system, logic, software). Logical and/or physical communication channels may be used to create an operable connection. For example, the I/O interface 314 may include a first communication interface devoted to sending signals, data, packets, or datagrams and a second communication interface devoted to receiving signals, data, packets, or datagrams. Alternatively, the I/O interface 314 may be implemented using a single communication interface.

The memory 310 may store a predefined function that may be used by the environmental controller 308 to control the speed of the fan 302. An input of the predefined function may be an inlet air temperature value measured by the second temperature sensor 306, and an output of the predefined function may be a target hotspot temperature value. In one embodiment, the predefined function may be a look-up table (e.g., a fan curve table) that includes pairs (e.g., thirty pairs) of inlet air temperature values and corresponding target hotspot temperature values. In another embodiment, the predefined function may be a linear equation, a polynomial equation or another equation (e.g., a fan curve equation).

In one embodiment, the second temperature sensor 306 may be located at or adjacent to the front 102 (e.g., at or adjacent to one slot 114 of the plurality) of the housing 100. The cooling system 300 may include an additional temperature sensor located at or adjacent to the back 104 (e.g., at or adjacent to the two axial fans 214) of the housing 100. The airflow direction through the fan 302 may be reversible such that depending on the configuration of the fan 302, the second temperature sensor 306 or the additional temperature sensor located at or adjacent to the back 104 of the housing 100 may measure the inlet air temperature. The environmental controller 308 may determine a minimum value of the air temperature value measured by the second temperature sensor 306 and the air temperature value measured by the additional temperature sensor. The environmental controller 308 may calculate the target hotspot temperature value based on the determined minimum value and the predefined function.

In one embodiment, an outlet air sensor (e.g., the additional temperature sensor located at or adjacent to the back 104 of the housing) may be used to check the overall thermal condition of the electrical hardware system. For example, the environmental controller 308 may calculate a temperature difference value $\Delta T$ between measured temperature values at or adjacent to the air inlet (e.g., using the second temperature sensor 306) and the air outlet (e.g., using the additional temperature sensor). The environmental controller 308 may compare the calculated temperature difference value $\Delta T$ to a predefined maximum air temperature rise value stored in the memory 310. The predefined maximum air temperature rise value may be specified for all conditions, or a plurality of predefined maximum air temperature rise values may be specified for a plurality of ambient air temperatures. If the environmental controller 308 determines that the calculated temperature difference value $\Delta T$ is greater than the predefined maximum air temperature rise value stored in the memory 310, the environmental controller 308 may increase the speed of the fan 302 to a maximum speed, issue a warning message, sound an alarm, shut down circuits in the electrical hardware system or shut down the one or more power supply units 212, for example.

The predefined function may be constructed using test data to specify a desired behavior for at least part (e.g., the power supply unit 212) of the electrical hardware system, in which the cooling system 300 is located. For example, the predefined function may represent the desired relationship between the inlet air temperature value and the hotspot temperature value. The target hotspot temperature values may be selected based on modeling, laboratory experimentation or tests, or simulations. For example, thermal tests may be run at different inlet air temperature values (e.g., different ambient (room) air temperatures) for worst-case loading (e.g., a maximum output load that the power supply unit 212 may deliver such as 1100 W) and normal air backpressure (e.g., 0.3 in. water). Two temperature sensors may be used to monitor the hotspot temperature value and the inlet air temperature value, respectively. Additional temperature sensors may be used to monitor temperature values at or adjacent to other heat generating electrical components in the electrical hardware system. At selected ambient air temperatures (e.g., 25° C., 35° C., 45° C., and 55° C.), the speed of the fan 302 may be manually controlled to produce desired hotspot component (or other electrical component) temperatures. At each of the selected ambient air temperatures, the inlet air temperature value and a desired hotspot component temperature value (e.g., the corresponding target hotspot temperature value) may be recorded as test data pairs.

The test data pairs may be plotted (e.g., for each data pair, the domain value may be the inlet air temperature value, and the range value may be the corresponding target hotspot temperature value), and a best fit curve may be generated for the test data pairs (e.g., four pairs for the selected ambient air temperatures of 25° C., 35° C., 45° C., and 55° C.). The best fit curve may be a linear equation or a second order equation, for example. In other embodiments, the best fit curve may be a higher order polynomial or another best fit equation. Best fit curve data points (e.g., thirty best fit curve data points from inlet air temperature values of 25° C. to 55° C., and corresponding target hotspot temperature values) may be used to construct the fan curve table stored in the memory 310 as the predefined function. In other words, the fan curve table may include, for example, thirty inlet air temperature values and thirty corresponding target hotspot temperature values. Alternatively or in addition, the best fit curve may be used as the fan curve equation stored in the memory 310 as the predefined function.

During operation of the cooling system 300, the environmental controller 308 may calculate the target hotspot temperature value based on the inlet air temperature value measured by the second temperature sensor 306 and the fan curve table. The environmental controller 308 may determine the closest inlet air temperature value in the fan curve table to the measured inlet air temperature value and output the corresponding target hotspot temperature value. In one embodiment, if the measured inlet air temperature value falls between two inlet air temperature values in the fan curve table, the environmental controller 308 may linearly interpolate between the two corresponding target hotspot temperature values and output the resulting target hotspot temperature value.

If the measured inlet air temperature value is less than all of the inlet air temperature values in the fan curve table, the environmental controller 308 may set the target hotspot temperature value to be a predetermined value such as, for example, the measured inlet air temperature value plus the difference between a minimum target hotspot temperature value and a minimum inlet air temperature value in the fan curve table. If the measured inlet air temperature value is greater than all of the inlet air temperature values in the fan curve table, the environmental controller 308 may set the target hotspot temperature value to be another predetermined value such as, for example, a maximum target hotspot temperature value in the fan curve table. In other embodiments, the environmental controller 308 may use other predetermined target hotspot temperature values stored in the memory 310 if the measured inlet air temperature value is outside of the inlet air temperature values in the fan curve table.

In one embodiment, the environmental controller 308 may calculate the target hotspot temperature value based on the measured inlet air temperature value and the fan curve equation. The environmental controller 308 may input the measured inlet air temperature value into the fan curve equation stored in the memory 310, and the target hotspot temperature value may be output.

The environmental controller 308 may calculate a difference value between a hotspot temperature value measured by the first temperature sensor 304 and the target hotspot temperature value output by the predefined function stored in the memory 310. The memory 310 may store a first convergence tolerance value (e.g., +1° C.) and a second convergence tolerance value (e.g., −2° C.). The first convergence tolerance value and the second convergence tolerance value may define when convergence to the target hotspot temperature value is reached. Other first and second convergence tolerance values may be used.

The environmental controller 308 may compare the difference value to the first convergence tolerance value. If the difference value is greater than the first convergence tolerance value (e.g., +1° C.), the hotspot component is hotter than target, and the environmental controller 308 generates or modifies the control signal input to the fan 302 to increase the speed of the fan 302. In one embodiment, the environmental controller 308 may increase the relative width of pulses in the train of on-off pulses in the PWM control signal to increase the speed of the fan 302.

The degree to which the control signal increases the speed of the fan 302 may depend on how large the calculated difference value is. For example, a first predefined difference value (e.g., +3° C.) may be stored in the memory 310. The sum of the target hotspot temperature value and the first predefined difference value may define a first transition temperature value, above which the speed of the fan 302 is controlled differently than at or below the first transition temperature value. For example, if the target hotspot temperature value is 40° C., the generated control signal may be different if the measured target hotspot temperature is 42° C. or 44° C. When the measured hotspot temperature value is much greater than (e.g., >3° C.) the target hotspot temperature value, the speed of the fan 302 may be increased quicker to protect the heat generating electrical components 206 from damage.

In one embodiment, if the calculated difference value (e.g., +2° C.) is greater than the first convergence tolerance value (e.g., +1° C.) but less than or equal to the first predefined difference value (e.g., +3° C.), the environmental controller 308 may wait a first time period (e.g., 10 s) before increasing the speed of the fan 302 by a predefined percentage (e.g., 2%), for example. The first time period may allow still changing temperatures to stop changing. If the measured hotspot temperature value falls below the first convergence tolerance value during the first time period, the first time period may be reset. In one embodiment, the first time period may be greater or less than ten seconds. In another embodiment, the first time period may be zero seconds.

If the calculated difference value (e.g., +4° C.) is greater than the first convergence tolerance value (e.g., +1° C.) and greater than the first predefined difference value (e.g., +3° C.), the environmental controller 308 may increase the speed of the fan 302 without waiting the first time period or another time period. The environmental controller 308 may increase the speed of the fan 302 based on a predefined fan speed curve generated from test data, for example. Other algorithms for fan speed control based on the calculated difference value may also be used.

The environmental controller 308 may also compare the difference value to the second convergence tolerance value. If the difference value is less than the second convergence tolerance value (e.g., −2° C.), the hotspot component is colder than target, and the environmental controller 308 generates or modifies the control signal input to the fan 302 to decrease the speed of the fan 302. In one embodiment, the environmental controller 308 may decrease the relative width of pulses in the train of on-off pulses in the PWM control signal to decrease the speed of the fan 302.

The degree to which the control signal decreases the speed of the fan 302 may depend on how large the calculated difference value is. For example, a second predefined difference value (e.g., −3° C.) may be stored in the memory 310. The sum of the target hotspot temperature value and the second predefined difference value may define a second transition temperature value, below which the speed of the fan 302 is controlled differently than at or above the second transition temperature value. For example, if the target hotspot temperature value is 40° C., the generated control signal may be different if the measured target hotspot temperature is 37.5° C. or 36° C. When the measured hotspot temperature value is much less than (e.g., 3° C.) the target hotspot temperature value, the environmental controller 308 may wait before decreasing the speed of the fan 302 to allow the temperature of the hotspot component to further settle.

In one embodiment, if the calculated difference value (e.g., −2.5° C.) is less than the second convergence tolerance value (e.g., −2.0° C.) but greater than or equal to the second predefined difference value (e.g., −3.0° C.), the environmental controller 308 may wait a second time period (e.g., 120 s), the first time period, or another time period before decreasing the speed of the fan 302 by a predefined percentage (e.g., 2%), for example. The second time period may allow still changing temperatures to stop changing. If the measured hotspot temperature value rises above the second convergence tolerance value during the second time period, the second time period may be reset.

If the calculated difference value (e.g., −4.0° C.) is less than the second convergence tolerance value (e.g., −2.0° C.) and less than the second predefined difference value (e.g., −3.0° C.), the environmental controller 308 may wait a third time period (e.g., 30 s), the second time period (e.g., 120 s) or a different time period. The environmental controller 308 may decrease the speed of the fan 302 based on the predefined fan speed curve generated from test data or another fan speed curve (e.g., a linear fan speed curve), for example. The algorithm for fan speed control described above may provide fan speed convergence and avoid fan speed oscillation, thus providing fan speed stability. Other algorithms for fan speed control based on the calculated difference value may also be used. In addition, offset values may be employed under predetermined operating conditions such as during emergency conditions or high ambient temperatures.

In other embodiments, the environmental controller 308 may adjust the target hotspot temperature value output by the predefined function or may adjust the control signal generated by the environmental controller 308 for certain operating conditions of the switch 200 or the power supply unit 212. For example, the environmental controller 308 may read or receive data for an operating parameter (e.g., a determined input voltage value, output voltage value, fan speed value, current value) in the switch 200. For example, the power supply unit 212 may use a bridge diode as the hotspot component. The bridge diode may represent the thermal condition of the power supply unit 212 well under most operating conditions. However, at high voltages (e.g., 220 VAC), the bridge diode may be cooler than other heat generating electrical components 206 in the power supply unit 212, and the fan 302 may run too slow (e.g., not enough air flow to provide adequate cooling). The environmental controller 308 may compare the determined input voltage value to a predefined or user-defined voltage value (e.g., 175 VAC) stored in the memory 310, and if the determined input voltage value is greater, the environmental controller 308 may subtract a voltage correction temperature value (e.g., 5° C.) from the target hotspot temperature value. The subtraction of the voltage correction temperature value may cause the fan 302 to run faster. The voltage correction temperature value may also be predefined or user-defined and stored in the memory 310.

In another example, a minimum air flow may be provided for one, some or all of the heat generating electrical components 206. The memory 310 may store one or more (e.g., one) predefined minimum fan speed functions. The predefined minimum fan speed function may be an equation (e.g., a linear equation) having an input of the measured inlet air temperature value and an output of a minimum fan speed value for the fan 302 in RPM, for example. When the environmental controller 308 generates or modifies the control signal input to the fan 302 to decrease the speed of the fan 302, the environmental controller 308 may not decrease the speed of the fan 302 below the minimum fan speed value calculated by the environmental controller 308.

The environmental controller 308 may automatically adjust the speed of the fan 302 to compensate for working condition change. For example, when the switch 200 transitions to a lighter load, the target hotspot temperature value remains the same for the measured inlet air temperature value. During lighter load operation of the switch 200, the measured hotspot temperature value falls below the target hotspot temperature value, and the environmental controller 308 reduces the speed of the fan 302 such that the target hotspot temperature value is maintained (e.g., within the first and second convergence tolerance values). Temperatures of the heat generating electrical components 206 (e.g., including the hotspot component) may be slightly cooler (e.g., 2.0° C. cooler) during lighter load operation of the switch 200, after the speed of the fan 302 has been adjusted.

As room temperature changes, the measured inlet air temperature value may also change. The environmental controller 308 may output a new target hotspot temperature value based on the changed measured inlet air temperature value and may increase or decrease the speed of the fan 302 such that the measured hotspot temperature value matches the new target hotspot temperature value (e.g., within the first and second convergence tolerance values).

If air backpressure changes (e.g., increases) such that the air flow rate within the switch 200 changes (e.g., decreases), the measured hotspot temperature value may also change (e.g., increase). The environmental controller 308 may change (e.g., increase) the speed of the fan 302 such that the measured hotspot temperature value matches the target hotspot temperature value (e.g., within the first and second convergence tolerance values). Similarly, if the altitude at which the switch 200 is operated changes (e.g., increases) such that the air density change (e.g., decreases), the measured hotspot temperature value may also change (e.g., increase). The environmental controller 308 may change (e.g., increase) the speed of the fan 302 such that the measured hotspot temperature value matches the target hotspot temperature value (e.g., within the first and second convergence tolerance values).

Figure 4:
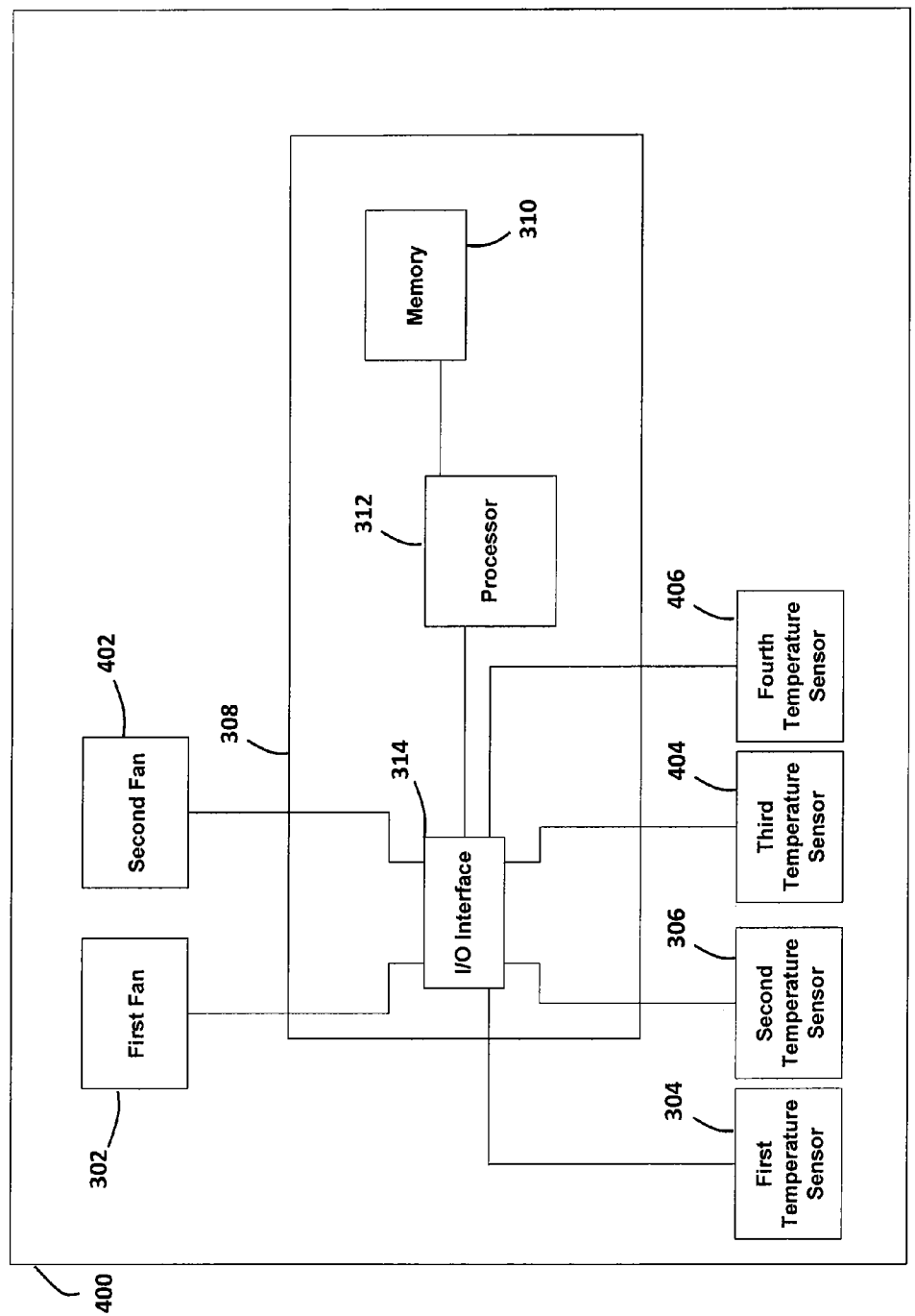
FIG. 4 illustrates another embodiment of a cooling system.

FIG. 4 illustrates an embodiment of a cooling system 400. The cooling system 400 regulates the internal temperature of the switch 200 or another electrical hardware system producing heat. The cooling system 400 includes the first fan 302, a second fan 402, the first temperature sensor 304, the second temperature sensor 306, a third temperature sensor 404, a fourth temperature sensor 406, and the environmental controller 308. The environmental controller 308 includes the memory 310, the processor 312, and the I/O interface 314. The first fan 302 may be one or both of the two axial fans 214 that are at or adjacent to the back 104 of the housing 100, and the second fan 402 may be the axial fan 218 of the power supply unit 212, for example.

The environmental controller 308 regulates the operation of the first fan 302 and the second fan 402. The environmental controller 308 may also measure one or more (e.g., four) temperatures associated with different positions in the switch 200 shown in FIG. 2 or a different electrical hardware system, and base the speed or operation of the first fan 302 and the second fan 402 on the measured temperatures.

The first temperature sensor 304 measures the temperature of a heat generating electrical component 206 on the MB 204 that represents the thermal condition of the heat generating electrical components 206 on the MB 204 (e.g., an MB hotspot component). The MB hotspot component may be a main DC-DC converter on the MB 204, or a case or junction of a heat generating electrical component 206 (e.g., a processor) on the MB 204. The first temperature sensor 304 may be located at or adjacent to the MB hotspot component. In one embodiment, the MB hotspot component is not a single heat generating electrical component 206 on the MB 204, but a group of heat generating electrical components 206 on the MB 204. The first temperature sensor 304 may be located at or adjacent to the heat sink 208 attached to the group of heat generating electrical components 206 on the MB 204. The second temperature sensor 306 measures the temperature of inlet air. The second temperature sensor 306 may be located at or adjacent to the front 102 (e.g., at or adjacent to one slot 114 of the plurality) or the back 104 (e.g., at or adjacent to the two axial fans 214) of the housing 100.

The third temperature sensor 404 measures the temperature of a heat generating electrical component 206 in the power supply unit 212 that represents the thermal condition of the power supply unit 212 (e.g., a power supply hotspot component). The power supply hotspot component may be an output rectifier diode in the power supply unit 212 or another heat generating electrical component in the power supply unit 212. The third temperature sensor 404 may be located at or adjacent to the power supply hotspot component. In one embodiment, the power supply hotspot component is not a single heat generating electrical component in the power supply unit 212, but a plurality of heat generating electrical components in the power supply unit. The third temperature sensor 404 may be located at or adjacent to a heat sink attached to the plurality of heat generating electrical components in the power supply unit 212.

The fourth temperature sensor 406 measures the temperature of inlet air to the power supply unit 212. If air is moved through the switch 200 from the front 102 to the back 104 of the housing 100, the fourth temperature sensor 406 may be located at or adjacent to the axial fan 218 of the power supply unit 212. If air is moved through the switch 200 from the back 104 to the front 102 of the housing 100, the fourth temperature sensor 406 may be located at or adjacent to the back 104 (e.g., at or adjacent to the power supply unit 212) of the housing 100. The third and fourth temperature sensors 404 and 406 may be any number of temperature sensors including, for example, thermocouples, thermistors, thermal diodes, infrared sensors, resistive thermal devices (RTD), digital temperature sensors or other devices.

The memory 310 may store a first predefined function that may be used by the environmental controller 308 to control the speed of the first fan 302. The memory 310 may also store a second predefined function that may be used by the environmental controller 308 to control the speed of the second fan 402. An input of the first predefined function may be an inlet air temperature value measured by the second temperature sensor 306, and an output of the first predefined function may be a target MB hotspot temperature value. An input of the second predefined function may be an inlet air temperature value measured by the fourth temperature sensor 406, and an output of the second predefined function may be a target power supply hotspot temperature value. The first and second predefined functions may be look-up tables (e.g., fan curve tables) that each includes pairs (e.g., thirty pairs) of inlet air temperature values and corresponding target hotspot temperature values, polynomial or other equations (e.g., fan curve equations) or combinations thereof. As described above, the first and second predefined functions may be constructed using test data to specify a desired behavior for the electrical hardware system, in which the cooling system 400 is located, for example.

During operation of the cooling system 400, the environmental controller 308 may calculate the target MB hotspot temperature value based on the inlet air temperature value measured by the second temperature sensor 306 and the first predefined function. The environmental controller 308 may also calculate the target power supply hotspot temperature value based on the inlet air temperature value measured by the fourth temperature sensor 406 and the second predefined function. The environmental controller 308 may calculate a first difference value, the first difference value being between an MB hotspot temperature value measured by the first temperature sensor 304 and the target MB hotspot temperature value output by the first predefined function stored in the memory 310. The environmental controller 308 may also calculate a second difference value, the second difference value being between a power supply hotspot temperature value measured by the third temperature sensor 404 and the target power supply hotspot temperature value output by the second predefined function stored in the memory 310. The environmental controller 308 may independently change the speed of the first fan 302 and the speed of the second fan 402 based on the calculated first difference value and the calculated second difference value, respectively, using the procedure discussed above or using a different procedure.

In other embodiments, the cooling system 400 may include additional fans, additional temperature sensors, and the memory 310 may store one or more additional predefined functions. The environmental controller 308 may change the speed of the additional fans based on temperature values measured by the additional temperature sensors and the one or more additional predefined functions. For example, in one embodiment, the switch 200 includes two power supply units 212, each of the two power supply units 212 including an axial fan 218. Each of the axial fans 218 may be independently controlled using corresponding pairs of temperature sensors (e.g., the third temperature sensor 404 and the fourth temperature sensor 406) and a corresponding predefined function stored in the memory 310.

In one embodiment, the cooling system 400 may include one or more additional temperature sensors (e.g., a fifth temperature sensor) that measure the temperatures of other heat generating electrical components in the power supply unit 212 (e.g., another power supply hotspot component), for example. The other power supply hotspot component may represent the thermal condition of the power supply unit 212 better than the power supply hotspot component during certain operating conditions (e.g., below 5% load). The environmental controller 308 may calculate a target power supply hotspot temperature value based on the inlet air temperature value measured by the fourth temperature sensor 406 and the second predefined function.

The environmental controller 308 may calculate a first power supply difference value, the first power supply difference value being between a power supply hotspot temperature value measured by the third temperature sensor 404 and the target power supply hotspot temperature value output by the second predefined function. The environmental controller 308 may also calculate a second power supply difference value, the second power supply difference value being between a power supply hotspot temperature value measured by the fifth temperature sensor and the target power supply hotspot temperature value output by the second predefined function. Alternatively, the second power supply difference value is between the power supply hotspot temperature value measured by the fifth temperature sensor and another target power supply hotspot temperature value output by another predefined function (e.g., a third predefined function) stored in the memory 310. The environmental controller 308 may change the speed of the second fan 402 based on the greater of the calculated first difference value and the calculated second difference value.

In another embodiment, the cooling system 400 may include one or more additional temperature sensors that measure the temperatures of other heat generating electrical components 206 on the MB 204 (e.g., other MB hotspot components), and the environmental controller 308 changes the speed of the first fan 302 based on the hottest MB hotspot component (e.g., between the MB hotspot component and the other MB hotspot components).

In one embodiment, the cooling system 400 includes a plurality of inlet air temperature sensors (e.g., the second temperature sensor 306 and the fourth temperature sensor 406), and the memory 310 stores a plurality of predefined functions (e.g., the first predefined function and the second predefined function) that corresponds to a plurality of hotspot components. The cooling system 400 also includes a plurality of hotspot component temperature sensors (e.g., the first temperature sensor 304 and the third temperature sensor 404). The environmental controller 308 may determine a minimum inlet air temperature value measured by the plurality of inlet air temperature sensors and calculate a plurality of target hotspot component temperatures based on the minimum inlet air temperature value and the plurality of predefined functions. The environmental controller 308 may determine a maximum difference value between hotspot temperature values measured by the plurality of hotspot component temperature sensors and the corresponding target hotspot component temperatures. The environmental controller 308 may adjust the speed of one or more fans (e.g., the first fan 302 and the second fan 402) based on the maximum difference.

Figure 5:
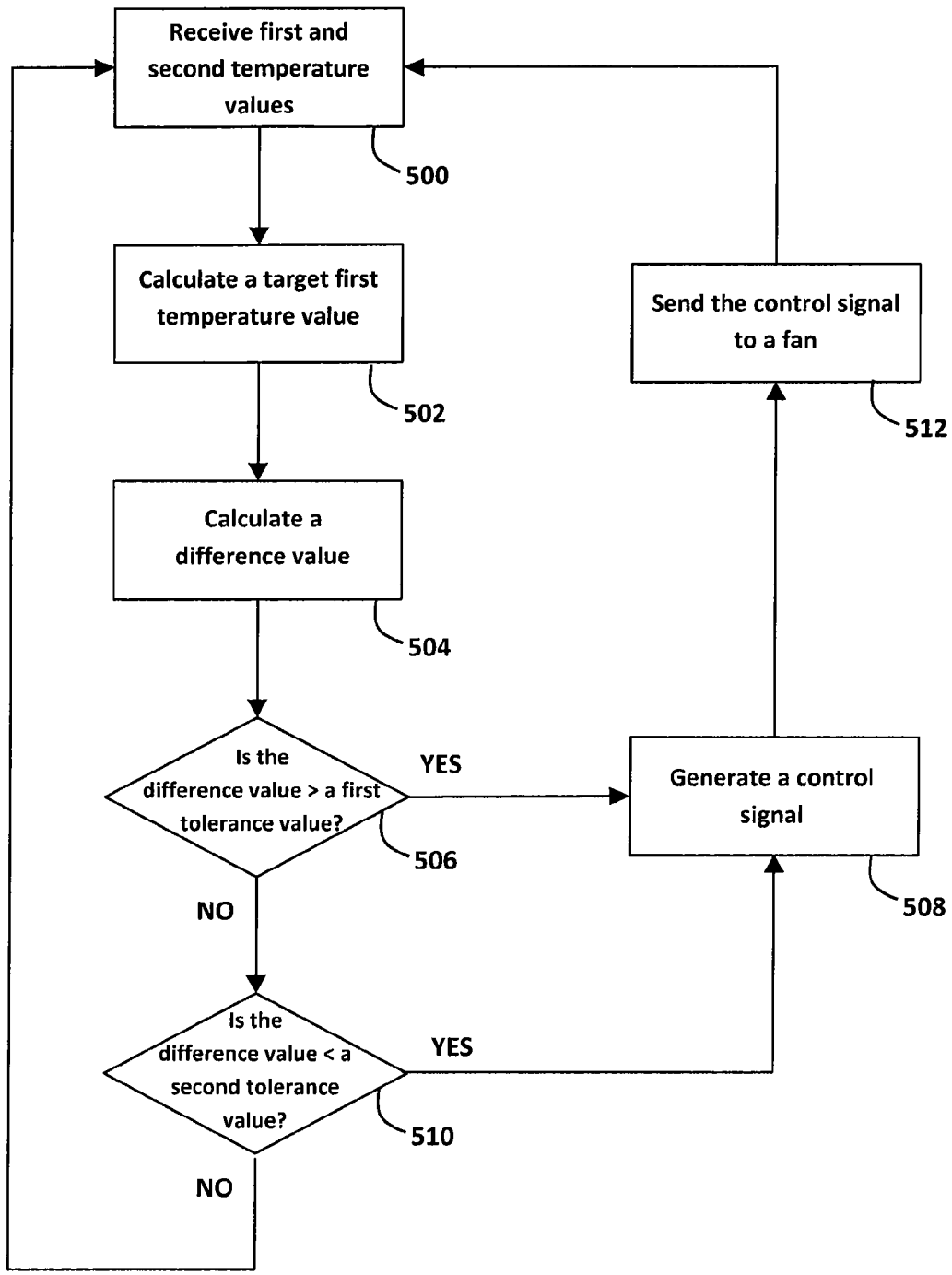
FIG. 5 illustrates a flow chart of an embodiment of fan speed control.

FIG. 5 illustrates a flow chart of one embodiment for fan speed control. The method is implemented in the order shown, but other orders may be used. Additional, different, or fewer acts may be provided.

In act 500, an environmental controller receives a first temperature value and a second temperature value. The first temperature value may be received from a first temperature sensor electrically connected to the environmental controller. The first temperature sensor may measure the first temperature value and may be located at a first position within an electrical hardware system such as a switch, for example. The first position within the electrical hardware system may be at or adjacent to an electrical component in the switch that represent the thermal condition of the switch (e.g., a hotspot component).

The second temperature value may be received from a second temperature sensor electrically connected to the environmental controller. The second temperature sensor may measure the second temperature value and may be located at a second position within the switch. The second position within the electrical hardware system may be at or adjacent to an air inlet of the switch, for example. The first and second temperature values may already be in a format that indicates the second temperature value in Fahrenheit or Celsius, for example. Alternatively, the second temperature value may be in a raw sensor format, and the environmental controller converts the raw sensor format to Fahrenheit or Celsius. In one embodiment, the first temperature value and/or the second temperature value may be user inputted and stored in the memory, and the environmental controller may receive the first temperature value and/or the second temperature value from the memory.

In act 502, the environmental controller calculates a target first temperature value (e.g., a target hotspot temperature value) as a function of the received second temperature value. The environmental controller may calculate the target first temperature value using a predefined function stored in the memory, for example. The predefined function may be a look-up table (e.g., a fan chart) or an equation (e.g., a fan curve), for example. The input of the predefined function may be the measured second temperature value, and the output of the function may be the target first temperature value. In act 504, the environmental controller calculates a difference value between the measured first temperature value and the target first temperature value.

In act 506, the environmental controller determines whether the difference value is greater than a first tolerance value (e.g., +1° C.). The first tolerance value may be stored in the memory. If the difference value is greater than the first tolerance value, the environmental controller generates a control signal to increase the speed of a fan in act 508. The control signal may be a PWM signal, for example. The PWM signal may include a train of on-off pulses. The widths of the on-off pulses may determine the level of power applied to the fan. The environmental controller may increase the widths of the on pulses if the difference value is greater than the first tolerance value, for example to increase the speed and the air flow of the fan. Alternatively, the environmental controller may increase the current and/or voltage supplied to the fan. The fan may be supported by the switch or may be included in another electrical hardware system.

The amount the control signal is configured to increase the speed of the fan may be a function of how large the difference value is compared to the first tolerance value. For example, if the difference value is much greater (e.g., >2° C.) than the first tolerance value, the speed of the fan may be increased as a function of the difference value (e.g., a percent increase in fan speed). If the difference value is not much greater than the first tolerance value, the environmental controller may wait a predefined period of time (e.g., 10 s) before the environmental controller generates the control signal to increase the speed of the fan by a predefined percentage (e.g., an increase of 2% of the speed of the fan).

If the difference value is less than the first tolerance value, the environmental controller determines whether the difference value is less than a second tolerance value (e.g., −2° C.) in act 510. The second tolerance value may be stored in the memory. If the difference value is less than the second tolerance value, the environmental controller may generate a control signal to decrease the speed of the fan in act 508. The control signal may be a PWM signal or a power signal, for example. In the case of a PWM signal, the width of the pulses may be decreased to decrease the rotational speed of the fan, whereas in the case of a power signal, the voltage and/or current may be decreased to slow the rotational speed of the fan.

The amount the control signal is configured to decrease the speed of the fan may be a function of how small the difference value is compared to the second tolerance value (or how large the absolute value of the difference value is compared to the absolute value of the second tolerance value). For example, if the difference value is much less than (e.g., >2° C.) the second tolerance value, the speed of the fan may be decreased as a function of the difference value (e.g., a percent decrease in fan speed). If the difference value is not much less than the second tolerance value, the environmental controller may wait another predefined period of time (e.g., 120 s) before the environmental controller generates the control signal to decrease the speed of the fan by the predefined percentage or another predefined percentage.

If the difference value is greater than the first tolerance value or less than the second tolerance value, the environmental controller sends the control signal to a motor of the fan in act 512. The control signal applies a control effort to the fan motor. The control effort may be an increase in speed or a decrease in speed.

In other embodiments, the environmental controller may receive temperature values from additional temperature sensors. For example, the environmental controller may receive temperature values from three temperature sensors that measure inlet air temperature (e.g., inlet air temperature sensors) at different positions in the electrical hardware system (e.g., at or adjacent to an air inlet of the switch, an air inlet of a first power supply unit and an air inlet of a second power supply unit). The environmental controller may also receive temperature values from three temperature sensors that measure hotspot component temperatures (e.g., hotspot temperature sensors) at different positions in the electrical hardware system (e.g., at or adjacent to a hotspot component on a motherboard of the switch, a hotspot component in the first power supply unit and a hotspot component in the second power supply unit).

The environmental controller may calculate a target hotspot component temperature for each of the three hotspot components based on temperature values received from the inlet air temperature sensors and one or more (e.g., three) predefined functions (e.g., look-up tables, equations, or the combination of both) stored in the memory, respectively. The environmental controller may calculate difference values between the temperature values received from the hotspot temperature sensors and the target hotspot component temperatures, respectively. One or more (e.g., three) fans or fan modules may be controlled as a function of the respective difference values.

Various embodiments described herein can be used alone or in combination with one another. The foregoing detailed description has described only a few of the many possible implementations of the present invention. For this reason, this detailed description is intended by way of illustration, and not by way of limitation.

The invention claimed is:

1. An apparatus comprising:
    a memory configured to store a predefined function; and
    a processor configured to:
        calculate a target temperature value for a desired temperature at a first position based on the predefined function and a measured temperature value at a second position;
        calculate a difference value between a measured temperature value at the first position and the target temperature value for the first position;
        generate a fan speed control signal based on the calculated difference value; and provide the control signal to a fan responsive to the control signal to maintain the measured temperature value at the first position to be within a predetermined tolerance of the target temperature value.

2. The apparatus of claim 1, wherein the predefined function is a look-up table or an equation, the measured temperature value at the second position is an input of the predefined function, and the target temperature value for the first position is an output of the predefined function.

3. The apparatus of claim 1, further comprising a first temperature sensor electrically connected to the processor, the first temperature sensor configured to generate the measured temperature value at the first position; and
    a second temperature sensor electrically connected to the processor, the second temperature sensor configured to generate the measured temperature value at the second position.

4. The apparatus of claim 1, wherein the first position is proximate to a heat generating electrical component supported by an electrical hardware system, and
    wherein the second position is proximate to an air inlet of the electrical hardware system.

5. The apparatus of claim 4, wherein the electrical hardware system comprises a network communications switch or a power supply.

6. The apparatus of claim 1, wherein the fan speed control signal generated by the processor is configured to increase the speed of a fan electrically connected to the processor in response to the difference value being greater than a first tolerance value stored in the memory, and
    wherein the fan speed control signal generated by the processor is configured to decrease the speed of the fan electrically connected to the processor in response to the difference value being less than a second tolerance value stored in the memory.

7. The apparatus of claim 6, wherein the processor is configured to calculate a minimum fan speed based on a minimum fan speed function stored in the memory and the measured temperature value at the second position, and
    wherein the fan speed control signal generated by the processor is configured to decrease the speed of the fan if the decreased fan speed is greater than the minimum fan speed.

8. The apparatus of claim 6, wherein the processor is configured to wait a first time period before generating the fan speed control signal configured to increase the speed of the fan in response to the difference value being greater than the first tolerance value and less than or equal to a first predefined difference value stored in the memory, and
    wherein the processor is configured to wait a second time period before generating the fan speed control signal configured to decrease the speed of the fan in response to the difference value being less than the second tolerance value and greater than or equal to a second predefined difference value stored in the memory.

9. The apparatus of claim 1, wherein the predefined function is a first predefined function, the difference value is a first difference value, and the memory is configured to store a second predefined function, and
wherein the processor is further configured to:
calculate a target temperature value for a third position based on the second predefined function and the measured temperature value at the second position;
calculate a second difference value, the second difference value being between a measured temperature value at the third position and the target temperature value for the third position; and
generate a fan speed control signal based on the greater of the first difference value and the second difference value.

10. A method comprising:
determining a first temperature value, the first temperature value being measured at a first position within an electrical hardware system;
determining a second temperature value, the second temperature value being determined at a second position within the electrical hardware system;
calculating, with a processor, a target first temperature value for a desired temperature at the first position as a function of the determined second temperature value;
calculating a difference value between the determined first temperature value and the calculated target first temperature value;
generating a control signal for a fan coupled with the electrical hardware system as a function of the calculated difference value and controlling a fan responsive to the control signal to maintain the determined temperature value at the first position within a predetermined tolerance of the target first temperature value.

11. The method of claim 10, wherein determining the first temperature value comprises generating the first temperature value using a first temperature sensor, and
wherein determining the second temperature value comprises generating the second temperature value using a second temperature sensor.

12. The method of claim 10, wherein the control signal comprises a pulse width modulated signal, and
wherein the widths of pulses in a train of on-off pulses forming the control signal determines a level of power applied to the fan.

13. The method of claim 12, wherein generating the control signal comprises increasing the widths of pulses in the pulse width modulated signal if the difference value is greater than a first tolerance value, and
wherein generating the control signal comprises decreasing the widths of pulses in the pulse width modulated signal if the difference value is less than a second tolerance value.

14. The method of claim 10, wherein calculating the target first temperature value comprises the processor using a fan curve look-up table or inputting the determined second temperature value into a predefined fan curve equation.

15. The method of claim 10, wherein the difference value is a first difference value, the control signal is a first control signal, and the fan is a first fan, the method further comprising:

determining a third temperature value, the third temperature value being determined at a third position within the electrical hardware system;
determining a fourth temperature value, the fourth temperature value being determined at a fourth position within the electrical hardware system;
calculating a target third temperature value as a function of the determined fourth temperature value;
calculating a second difference value, the second difference value being a difference value between the determined third temperature value and the calculated target third temperature value; and
generating a second control signal to control a speed of a second fan of the electrical hardware system as a function of the second difference value.

16. The method of claim 10, wherein determining the second temperature value comprises determining a minimum value between a measured temperature value proximate to an air inlet of the electrical hardware system and a measured temperature value proximate to an air outlet of the electrical hardware system, and
wherein the second temperature value is the minimum value, and the second position is proximate to the air inlet or the air outlet of the electrical hardware system.

17. The method of claim 10, further comprising determining an operating parameter value for the electrical hardware system; and
adjusting the target first temperature value if the determined operating parameter value is above a predefined operating parameter value.

18. A non-transitory tangible storage media encoded with logic, the logic executable by a processor to:
calculate a target temperature value for a desired temperature at a first position as a function of temperature data for a second position;
calculate a difference value between measured temperature data for the first position and the target temperature value for the first position;
generate a control signal based on the difference value and controlling a fan responsive to the control signal to maintain the temperature data for the first position within a predetermined tolerance of the target temperature value for the first position.

19. The non-transitory tangible storage media of claim 18, further comprising logic executable by the processor to:
receive the first temperature data from a first temperature sensor in or on an electrical hardware system; and
receive the second temperature data from a second temperature sensor in or on the electrical hardware system.

20. The non-transitory tangible storage media of claim 18, further comprising logic executable by the processor to calculate the target temperature value for the first position using a look up table or an equation.

21. The non-transitory tangible storage media of claim 18, wherein the control signal is generated to increase a speed of a fan if the difference value is greater than a first tolerance value, and
wherein the control signal is generated to decrease the speed of the fan if the difference value is less than a second tolerance value.

* * * * *